(12) United States Patent
Johnson et al.

(10) Patent No.: US 12,087,760 B2
(45) Date of Patent: Sep. 10, 2024

(54) SEMICONDUCTOR DEVICES AND METHODS OF MANUFACTURING SEMICONDUCTOR DEVICES

(71) Applicant: SEMICONDUCTOR COMPONENTS INDUSTRIES, LLC, Phoenix, AZ (US)

(72) Inventors: Derrick Johnson, Phoenix, AZ (US); Yupeng Chen, San Jose, CA (US); Ralph N. Wall, Pocatello, ID (US); Mark Griswold, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 232 days.

(21) Appl. No.: 17/662,263

(22) Filed: May 6, 2022

(65) Prior Publication Data

US 2023/0361107 A1 Nov. 9, 2023

(51) Int. Cl.
*H01L 27/02* (2006.01)
*H01L 27/092* (2006.01)

(52) U.S. Cl.
CPC ...... *H01L 27/0262* (2013.01); *H01L 27/0928* (2013.01)

(58) Field of Classification Search
CPC ............. H01L 27/0262; H01L 27/0928; H01L 29/1016; H01L 29/102; H01L 2924/13028; H01L 2924/13024; H01L 2924/13034–13035; H01L 29/74–749

See application file for complete search history.

(56) References Cited

U.S. PATENT DOCUMENTS

| 2013/0009207 | A1 | 1/2013 | Campi et al. |
| 2014/0235026 | A1 | 8/2014 | Zhan et al. |
| 2016/0163691 | A1 | 6/2016 | Edwards et al. |
| 2017/0077082 | A1 | 3/2017 | Marreiro et al. |
| 2020/0258818 | A1* | 8/2020 | Menard .................. H01L 23/14 |

OTHER PUBLICATIONS

International Electrotechnical Commission, International Standard, "Electromagnetic Compatability (EMC)—Part 4-5: Testing and Measurement Techniques—Surge Immunity Test," Edition 2.0, Nov. 2005.

* cited by examiner

*Primary Examiner* — Wasiul Haider

(74) *Attorney, Agent, or Firm* — Kevin B. Jackson

(57) ABSTRACT

In an example, a semiconductor device includes a semiconductor substrate of a first conductivity type and a semiconductor region of the first conductivity type over the semiconductor substrate. A well region of a second conductivity type is in the semiconductor region. A doped region of the first conductivity type is in the well region. A doped region of the second conductivity type is in the well region. A doped region of the second conductivity type is in the semiconductor substrate at a bottom side. A doped region of the first conductivity type is in the semiconductor substrate at the bottom side. A first conductor is at a top side of the semiconductor region and a second conductor is at the bottom side. In some examples, one or more of doped regions at the bottom side is a patterned doped region.

20 Claims, 11 Drawing Sheets

| VSurge (V) | Peak Ipp (A) | Vclamp @pkIpp(V) | Tmax (K) | Vbr@1mA (V) | Substrate Concentration (atoms/cm$^3$) |
|---|---|---|---|---|---|
| 650 | 95.65 | 14.10 | 598.70 | 19.12 | 2.6x10$^{16}$ |
| 700 | 103.47 | 15.09 | 670.40 | 19.12 | 2.6x10$^{16}$ |
| 760 | 112.31 | 16.43 | 801.10 | 19.12 | 2.6x10$^{16}$ | ical disturbance, such as lightning
SEMICONDUCTOR DEVICES AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronics and, more particularly, to semiconductor device structures and methods of forming semiconductor devices.

BACKGROUND

Surge immunity generally refers to the ability of a device, equipment, or system to perform without degradation in the presence of an electrical disturbance, such as lightning transients or power system switching transients. Lightning transients are events that produce surge voltages and include i) direct lightning strokes to an external circuit that injects high currents, which then produce voltages either by flowing through ground resistance or flowing through impedance of the external circuit; ii) indirect lightning strokes that produce electromagnetic fields that induce voltages/current on the conductors inside and/or outside of a building; or iii) lightning ground current flow that results from nearby direct-to-earth discharges coupling common ground paths of a grounding system. Power system switching transients can include i) major power system switching disturbances; ii) minor local switching activity or load changes in a power distribution system; iii) resonating circuits associated with switching devices; or iv) various system faults, such as short circuits and arcing faults.

Surge protection has been increasingly important in electronic applications including for battery and charging lines for mobile power applications. Emerging applications are requiring integrated circuit (IC) operation and maximum current (Imax) of 5 amps and 20 amps and maximum working reverse voltage (Vrwm) limits of 16 volts, 20 volts, 40 volts, and even higher. Conventional non-snapback surge devices, such as Zener diode devices have failed to provide protection in these applications due to low current density and high conduction resistance. Conventional snapback devices, such as lateral semiconductor-controlled rectifier (SCR) devices have holding currents and holding voltages that do not meet the required Imax and Vrwm specifications and have latch-up problems under high power applications.

Accordingly, structures and methods are needed that overcome the shortcomings of prior surge protection devices, including structures and methods that result in surge protection devices having higher holding currents, higher holding voltages, higher current density capability, and that do not latch-up in high power applications. In addition, it would be beneficial for the structures and methods to utilize existing manufacturing capability and support different types of semiconductor packaging interconnects.

Figure 1A:
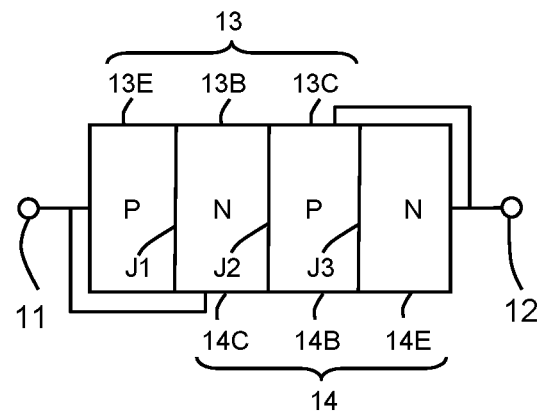
FIG. 1A is a simplified cross-sectional view of a semiconductor-controlled rectifier (SCR) device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

In general, the present examples relate to semiconductor device structures and methods of making semiconductor devices, such as surge protection devices that utilize a semiconductor-controlled rectifier (SCR) having vertical current flow configuration (as opposed to a lateral current flow configuration). In some examples, the SCR device is provided using dual-sided semiconductor wafer processing (that is, the semiconductor device has patterned device regions or selectively formed device regions on opposing major sides of the wafer) with the anode at a top side of the SCR device, and the cathode at the bottom side of the SCR device. In some examples, the voltage characteristics of the SCR device can be adjusted or tuned using the dopant concentration of a P-type conductivity semiconductor region and the dopant concentration/dopant profile of an N-type conductivity well region. The SCR device is configured to snapback at a higher holding current than the maximum operating current of the application the SCR device is protecting. Also, by its configuration the SCR device avoids the latch-up issues associated with prior devices. In addition, the deep voltage snapback characteristic (Vclamp) of the SCR device at high current (Ipp) materially increases its surge current handling capabilities. In addition, the surge characteristics of the SCR device (for example, Vclamp and IPP) can be optimized using mask layout dimensions at both the anode side and the cathode side of the SCR device. The SCR device is configured in some examples as a two terminal semiconductor device in that it does not have a separately biased gate control terminal.

Further, it was found in practice that the highest lattice temperatures in the dual-sided SCR device of the present description resulting from a surge event occur closer to the bottom side (that is, the cathode side) of the SCR device, and the present configuration better facilitates the incorporation of heat dissipation approaches compared to previous SCR devices. The SCR device according to the present description further supports different types of semiconductor package interconnect structures, such as wire bonds, ribbons, or clips.

In an example, a semiconductor device has a region of semiconductor material comprising a top side; a bottom side opposite to the top side; a semiconductor substrate of a first conductivity type; a semiconductor region of the first conductivity type over the semiconductor substrate. A well region of a second conductivity type opposite to the first conductivity type is in the semiconductor region. A first doped region of the first conductivity type is in the well region. A second doped region of the second conductivity type is in the well region. A third doped region of the second conductivity type is in the semiconductor substrate at the bottom side. A fourth doped region of the first conductivity type is in the semiconductor substrate at the bottom side. A first conductor is coupled to the first doped region and the second doped region at the top side. A second conductor is coupled to the third doped region and the fourth doped region at the bottom side. One or more of third doped region or the fourth doped region are patterned doped regions and semiconductor device is configured as a dual-sided semiconductor-controlled rectifier (SCR) device.

In an example, a semiconductor device includes a region of semiconductor material having a top side; a bottom side opposite to the top side; a semiconductor substrate of a first conductivity type and a semiconductor substrate thickness; and a semiconductor region of the first conductivity type over the semiconductor substrate, wherein the semiconductor region has a higher peak dopant concentration than the semiconductor substrate. A well region of a second conductivity type opposite to the first conductivity type is in the semiconductor region. A first doped region of the first conductivity type is in the well region. A second doped region of the second conductivity type is in the well region laterally adjacent to the first doped region. A third doped region of the second conductivity type is in the semiconductor substrate at the bottom side. A fourth doped region of the first conductivity type is in the semiconductor substrate at the bottom side laterally adjacent to the third doped region. An anode terminal is coupled to the first doped region and the second doped region at the top side. A cathode terminal is coupled to the third doped region and the fourth doped region at the bottom side. It is provided that the fourth doped region is a patterned doped region; and the fourth doped region comprises two portions that are on opposing sides of the third doped region in a cross-sectional view. In some examples, the semiconductor device is configured as a two-terminal dual-sided vertical semiconductor-controlled rectifier (SCR) device.

In an example, a method of manufacturing a semiconductor device includes providing a region of semiconductor material comprising a top side; a semiconductor substrate of a first conductivity type; and a semiconductor region of the first conductivity type over the semiconductor substrate. The method includes providing a well region of a second conductivity type opposite to the first conductivity type in the semiconductor region. The method includes providing a first doped region of the first conductivity type in the well region. The method includes providing a second doped region of the second conductivity type in the well region. The method includes providing a first conductor coupled to the first doped region and the second doped region at the top side. The method includes reducing the thickness of the semiconductor substrate to provide the semiconductor substrate with a substrate thickness and to define a bottom side of the region of semiconductor material opposite to the top side. The method includes forming a third doped region of the second conductivity type in the semiconductor substrate at the bottom side. The method includes selectively forming a fourth doped region of the first conductivity type in the semiconductor substrate at the bottom side. The method includes providing a second conductor coupled to the third doped region and the fourth doped region at the bottom side. In some examples, the semiconductor device is configured as a two-terminal dual-sided semiconductor-controlled rectifier (SCR) device.

Other examples are included in the present disclosure. Such examples may be found in the figures, in the claims, or in the description of the present disclosure.

Figure 1B:
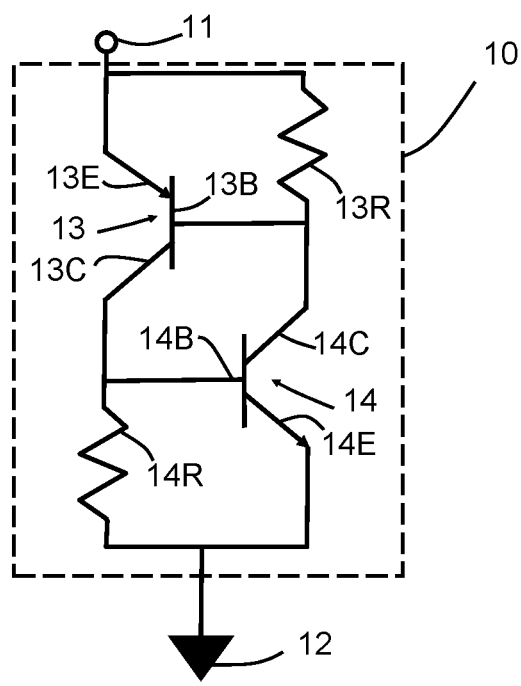
FIG. 1B schematically illustrates an example circuit representation of the semiconductor device of FIG. 1A.
Figure 3:
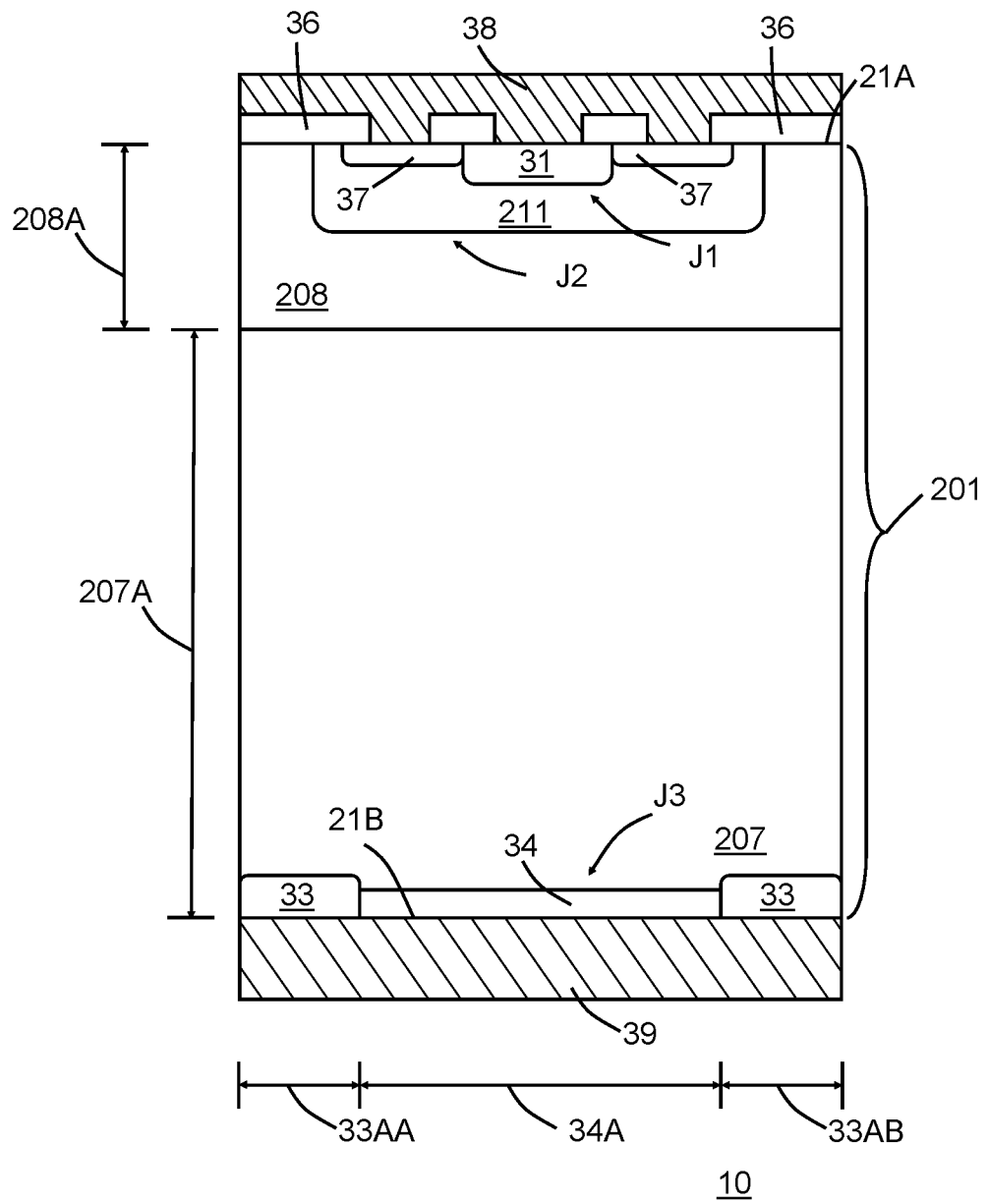
FIG. 3 illustrates a cross-sectional view of an example semiconductor device in accordance with the present description.

FIG. 1A is a simplified cross-sectional view of a semiconductor device 10 configured as an SCR device. FIG. 1B schematically illustrates an example transistor circuit representation of semiconductor device 10. More details of semiconductor 10 further configured in accordance with the present description are illustrated in FIG. 3, which will be described later.

As shown in FIG. 1A, semiconductor device 10 is a four-layer P-N-P-N semiconductor structure with an anode terminal 11 and a cathode terminal 12. An SCR device is effective in blocking current through anode terminal 11 and cathode terminal 12 until the SCR device is turned on by a triggering mechanism. As will be described in more detail later, such a triggering mechanism can include raising the positive voltage across the SCR device (i.e., the anode positive with respect to the cathode) to a peak value referred to as the trigger voltage (Vt1), the breakover voltage (Vbo), or the (forward biased) DC breakdown voltage of the SCR device.

With reference to both FIG. 1A and FIG. 1B, an SCR device can be described using a two-transistor analogy that includes a PNP transistor 13 (which can be referred to as a trigger transistor) connected with an NPN transistor 14 (which can be referred to as a latching transistor). Region 13E is an emitter region, region 13B is a base region, and region 13C is a collector region respectively of PNP transistor 13. Emitter region 13E and base region 13B form a junction J1, and base region 13B and collector region 13C form a junction J2. Region 14E is an emitter region, region 14B is a base region, and region 14C is a collector region respectively of NPN transistor 14. Emitter region 14E and base region 14B form a junction J3, and base region 14B and collector region 14C are defined by junction J2.

Emitter region 13E is connected to anode terminal 11, which can also be connected as an input supply terminal for associated system components that semiconductor device 10 is configured to protect from surge events. Emitter 14E is connected to cathode terminal 12. In the present example, base region 14B of NPN transistor 14 is also connected to cathode terminal 12, which provides a resistive path 14R, and base region 13B of PNP transistor 13 is connected to anode terminal 11, which provides a resistive path 13R.

As shown in FIGS. 1A and 1B, collector region 14C of NPN transistor 14 is in common with base region 13B of PNP transistor 13, and base region 14B of NPN transistor 14 is in common with collector region 13C of PNP transistor 13. More particularly, junction J2 functions as the collector junction for both transistors. In this configuration, the collector current of PNP transistor 13 drives base region 14B of NPN transistor 14, and the base current of the PNP transistor 13 is dictated by the collector current of NPN transistor 14.

When the device is at an "off" state (voltage across 11 and 12 is less than Vrwm), the voltage blocking junction is J2, a small leakage current is generated from junction J2, and forward junctions J1 and J3 act as conduction path for the small leakage current from junction J2. As the applied voltage across anode terminal 11 and cathode terminal 12 increases to Vbr, avalanche breakdown of junction J2 takes place, and the collector current of PNP transistor 13 increases sharply due to the transistor effect. The increased collector current flows to the resistor 14R and develops the voltage across junction J3. The current eventually reaches a level where this voltage forward biases junction J3 of NPN transistor 14 into conduction. Once NPN transistor 14 is at an "on" state, its collector current provides base current to PNP transistor 13 as a feedback mechanism to keep the SCR device latched in a conducting state. To turn the SCR device off, the current flowing through the device must fall below the holding current. This can be done, for example, by reducing the applied voltage to a level that turns off the feedback mechanism. When the SCR device is forward biased (cathode terminal 12 positively biased with respect to anode terminal 11), a forward conduction path is provided from cathode terminal 12 to anode terminal 11 through resistor 14R, junction J2, and resistor 13R.

Figure 2:
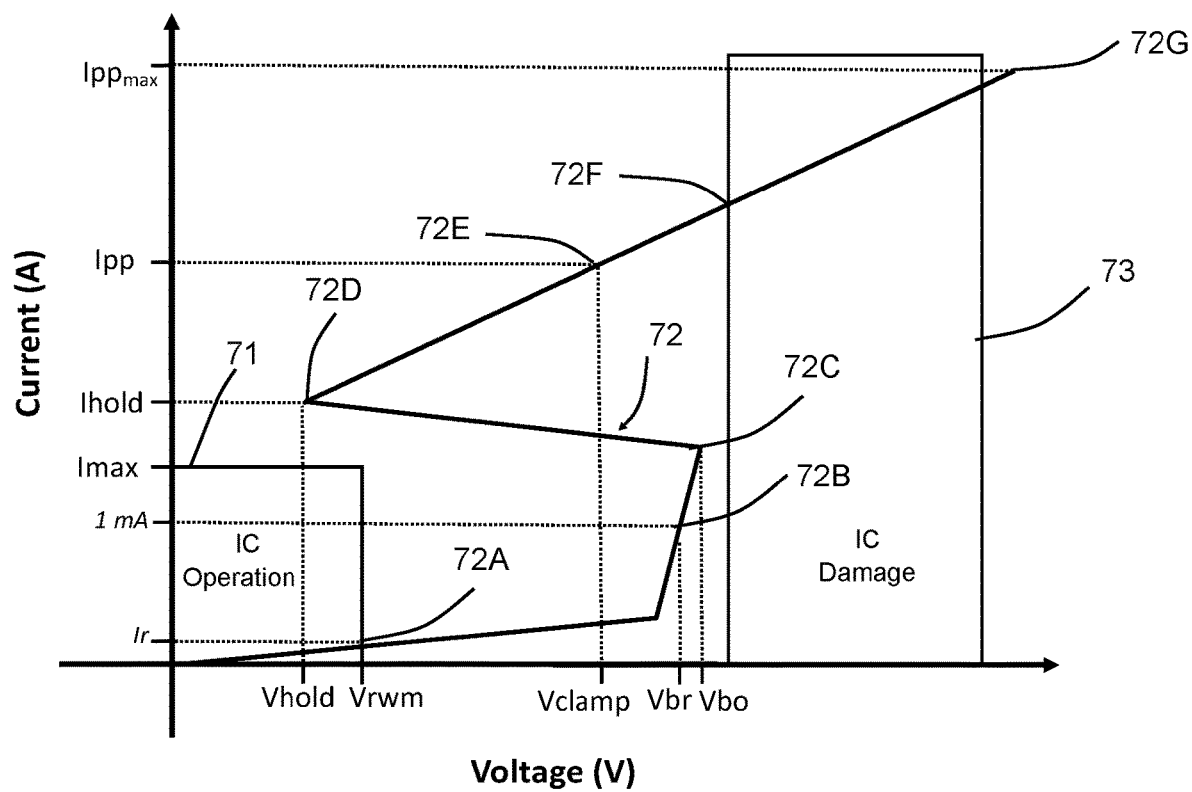
FIG. 2 graphically illustrates an example current/voltage (IV) characteristic of a semiconductor device in accordance with the present description.

FIG. 2 graphically illustrates an example current/voltage (IV) characteristic 72 of semiconductor device 10 configured as an SCR device in accordance with the present description. The system or components that semiconductor device 10 protects is designated as system or IC Operation area 71, which is bounded on the current axis by maximum current rating (Imax) of the system and bounded on the voltage axis by the specified maximum working reverse voltage rating (Vrwm) of the system (for example, 5 volts, 16 volts, 20 volts, 40 volts, or more). Point 72A of IV characteristic 72 is rated leakage current (Ir) of semiconductor device 10 at Vrwm; point 72B is the rated turn-on voltage (Vbr) of semiconductor device 10 at 1 mA; point 72B is the breakover voltage (Vbo) or trigger voltage (Vt1) of semiconductor device 10 where snap-back occurs; point 72D is the holding current (Ihold) of semiconductor device 10, which is the minimum current required to keep semiconductor device 10 in the conducting state; point 72E is a specified clamping voltage (Vclamp) of semiconductor device 10 at a specified non-repetitive surge current Ipp on the slope of IV characteristic 72 above Ihold and below a current level and voltage level that would damage the system; point 72F is a current level and voltage level where destructive damage to the system (denoted as IC Damage area 73 in FIG. 2) can occur; and point 72G is the is a current level (Ippmax) and voltage level for semiconductor device 10 above which destructive damage to semiconductor device 10 can occur.

Semiconductor device 10 is intended to remain in an inactive state during normal operation (Vo) of the associated system components semiconductor device 10 protects but turns on when a surge event occurs. In this way semiconductor device 10 protects the associated system components from damage or destruction. The breakover voltage (Vbo) of semiconductor device 10 should exceed the maximum working reverse voltage (Vrwm) of associated system components it is protecting. In addition, the breakover voltage should be less than a surge voltage large enough to damage the associated systems components. Further, the holding current (Ihold) of semiconductor device 10 needs to be as high as possible above maximum current rating (Imax) of the system. With the market requiring higher maximum current ratings (e.g., above 5 amps in some applications and above 20 amps in other applications) design challenges had to be overcome to provide semiconductor device 10 with, among other things, higher holding current capability and good thermal response.

FIG. 3 illustrates a cross-sectional view of an example of semiconductor device 10 in accordance with the present description. In some examples, semiconductor device 10 includes a region of semiconductor material 201, which can also be referred to as a semiconductor workpiece. In the present example, region of semiconductor material 201 includes a semiconductor substrate 207 and a semiconductor region 208 over semiconductor substrate 207. In some examples, region of semiconductor material 201 comprises silicon, but it is understood that other semiconductor materials can be used, such as IV-IV semiconductor materials. Region of semiconductor material 201 has a top side 21A defined in this example by the top surface of semiconductor region 208 and a bottom side 21B defined in this example by the bottom surface of semiconductor substrate 207. In some examples, semiconductor substrate 207 and semiconductor region 208 have a P-type conductivity and semiconductor region 208 has a higher peak dopant concentration than semiconductor substrate 207. In accordance with the present description, semiconductor substrate 207 is configured as a primary drift region for semiconductor device 10.

By way of example, when semiconductor device 10 is rated as a 16 volt (Vrwm) device, semiconductor substrate 207 can have a dopant concentration of $1.0 \times 10^{16}$ atoms/cm$^3$ to $4.0 \times 10^{16}$ atoms/cm$^3$ and can be doped with boron. In this example, semiconductor region 208 can have a dopant concentration of $4.5 \times 10^{17}$ atoms/cm$^3$ to $6.0 \times 10^{17}$ atoms/cm$^3$ and can be doped with boron. In some examples, semiconductor region 208 can be formed using an epitaxial growth process and can be doped to have a predetermined dopant profile during the epitaxial growth process. In the present example, semiconductor substrate 207 can have a thickness 207A of 75 microns to 140 microns. In some examples, thickness 207A is 75 microns to 100 microns. Since semiconductor substrate 207 is the primary drift region for semiconductor device 10, thickness 207A affects, among other things, the holding current of semiconductor device 10. For at least that purpose, thickness 207A is substantially less than the thickness of conventional power semiconductor substrates. In the present example, semiconductor region 208 can have a thickness 208A of 7 microns to 15 microns.

By way of example, when semiconductor device 10 is rated as a 20 volt (Vrwm) device, semiconductor substrate 207 can have a dopant concentration of $2.0 \times 10^{16}$ atoms/cm$^3$ to $3.0 \times 10^{16}$ atoms/cm$^3$ and can be doped with boron. In this example, semiconductor region 208 can have a dopant concentration of $2.0 \times 10^{17}$ atoms/cm$^3$ to $4.0 \times 10^{17}$ atoms/cm$^3$ and can be doped with boron. In the present example, semiconductor substrate 207 can have a thickness 207A of 75 microns to 140 microns. In some examples, thickness 207A is 75 microns to 100 microns. In the present example, semiconductor region 208 has a thickness 208A of 7 microns to 15 microns.

Semiconductor device 10 includes a well region 211 extending from top side 21A into semiconductor region 208. In the present example, well region 211 has an N-type conductivity and forms junction J2 of the SCR device with semiconductor region 208. In some examples, well region 211 is formed using masking and doping techniques, such as photolithographic masking and ion implantation/anneal techniques. For a 16 volt (Vrwm) device, well region 211 can be doped with phosphorous using an ion implantation dose between $1.0 \times 10^{13}$ atoms/cm$^2$ and $2.0 \times 10^{13}$ atoms/cm$^2$ at 100 keV and an anneal time of 280 minutes to 320 minutes at 1150 degrees Celsius. For a 20 volt (Vrwm) device, well region 211 can be doped with phosphorous using an ion implantation dose between $4.0 \times 10^{13}$ atoms/cm$^2$ and $6.0 \times 10^{13}$ atoms/cm$^2$ at 100 keV and an anneal time of 140 minutes to 160 minutes at 1150 degrees Celsius. In some examples, well region 211 extends into semiconductor region 208 to a depth between 2 microns and 5 microns. It is understood that the dimensions, the dopant concentration, or the dopant profile of well region 211 can be used to adjust or tune the electrical characteristics (e.g., working voltages and surge characteristics) of semiconductor device 10.

Semiconductor device 10 includes a doped region 31 extending from top side 21A into well region 211, which in the present example is a P-type conductivity doped region. Doped region 31 forms junction J1 of the SCR device with well region 211 and can be formed using masking and doping techniques described previously. In some examples, doped region 31 is doped with boron using an ion implantation dose between $8.0 \times 10^{14}$ atoms/cm$^2$ and $1.0 \times 10^{15}$ atoms/cm$^2$ at 40-60 keV. It is understood that the dimensions, the dopant concentration, or the dopant profile of doped region 31 can be used to adjust or tune the electrical characteristics (e.g., working voltages and surge characteristics) of semiconductor device 10.

In some examples, semiconductor device 10 includes a doped region 37 extending from top side 21A into well region 211 adjacent to doped region 31. In some examples, doped region 37 includes portions that abut doped region 31 in the cross-sectional view. Doped region 37 is an N-type conductivity doped region that can be formed using masking and doping techniques as described previously. In some examples, doped region 37 is doped with phosphorous using an ion implantation dose between $6.0 \times 10^{14}$ atoms/cm$^2$ and $8.0 \times 10^{14}$ atoms/cm$^2$ at 60 keV. Both doped region 31 and doped region 37 can be annealed at 1100 degrees Celsius for 20 minutes to 40 minutes. It is understood that sequence of ion implants described above can be reversed. Doped region 37 has a higher peak dopant concentration than well region 211 and functions as a high electric field region that forces current from junction J1 downward from top side 21A.

In accordance with the present description, semiconductor device 10 further includes a doped region 34 extending from bottom side 21B into semiconductor substrate 207, which in the present example is an N-type conductivity doped region. Doped region 34 forms junction J3 of the SCR device with semiconductor substrate 207. In some examples, doped region 34 is a patterned doped region or selectively formed doped region, which can be formed using dual-sided photolithography processing. That is, in some examples doped region 34 is not a continuous doped region that extends laterally across the entirety of bottom side 21B of region of semiconductor material 201. Semiconductor device 10 further includes a doped region 33 extending from bottom side 21B into semiconductor substrate 207 and, in some examples, bounds or surrounds doped region 34. In the present example, doped region 33 is a P-type conductivity doped region. Similar to doped region 34, doped region 33 is a patterned doped region or selectively formed and can be formed using dual-sided photolithographic processing techniques. Doped region 34 and doped region 33 can be formed using low to medium current ion implantation techniques and can be annealed/activated using localized anneal techniques, such as laser annealing techniques. Implant doses similar to doped region 31 and doped region 37 can be used to form doped region 34 and doped region 33 respectively. In some examples, doped region 34 can be an unmasked or blanket dope region, and doped region 33 can be a patterned doped region. In other examples, one or more of doped region 34 and doped region 33 is a patterned doped region.

In accordance with the present description, doped region 34 has a width 34A and doped region 33 has widths 33AA and 33AB. More particularly, widths 34A, 33AA, and 33AB are used to assist in setting the holding current and surge characteristics (e.g., Ipp and Vclamp) of semiconductor device 10. Doped region 33 is a base contact for NPN transistor 14 (illustrated in FIG. 1B) so the larger the area of doped region 33 (for example, increasing widths 33AA and 33AB or decreasing width 34A), the higher the holding current. That is, width 34A and the combined widths of 33AA and 33AB can be different. This is used as a design variable for semiconductor device 10 in accordance with the present description. In some examples, widths 33AA and 33AB are pre-selected during mask design/layout to adjust or achieve a desired holding current for semiconductor device 10.

By way of example, for a 16 volt (Vrwm) device with a given device width, width 34A can be 60% of the device width and widths 33AA and 33AB can combine to be 40% (e.g., 20% on each side of doped region 34). By way of example, for a 20 volt (Vrwm) device with a given device width, width 34A can be 40% of the device width and widths 33AA and 33AB can combine to be 60% (e.g., 30% on each side of doped region 34). In some examples, width 34A is between 40% and 60% of the device width.

Semiconductor device 10 further includes dielectric 36 over top side 21A of region of semiconductor material 201. Dielectric 36 can be provided prior to the formation of doped regions 31 and 37 and can comprise one or more dielectric layers including for example, a field dielectric layer and a pre-ohmic dielectric layer that each can have different thicknesses. In some examples, dielectric 36 comprises an oxide, a nitride, combinations thereof, or other dielectrics as known to one of ordinary skill the art. Dielectric 36 can be provided using thermal growth processes or chemical vapor deposition (CVD) processes. Dielectric 36 can be patterned to provide openings for doped regions 31 and 37 using, for example, photolithographic and etch processes.

Semiconductor device 10 further includes conductor 38 over top side 21A and dielectric 36 contacting doped region 31 and doped region 37 through openings in dielectric 36, and a conductor 39 over or adjacent to bottom side 21B contacting doped region 34 and doped region 33. In the present example, conductor 38 provides the anode terminal and conductor 39 provides the cathode terminal for semiconductor device 10. In some examples, conductors 38 and 39 comprise one or more metals or metal layers. In some examples, conductor 38 can comprise copper (in some examples with an intervening barrier material) or an aluminum alloy, such as aluminum (Al)-silicon (Si)-copper (Cu) alloy. In some examples, a solderable material or sintering material is provided over the aluminum alloy. In other examples, conductors 38 and 39 can comprise titanium (Ti) nickel (Ni) silver (Ag) or chromium (Cr) Ni gold (Au). Conductors 38 and 39 can be formed using evaporation, plating, sputtering, or other deposition techniques. In some examples, conductors 38 and 39 have a thickness between about 2 microns and 20 microns or more and conductor 39 can have a greater thickness than conductor 38. As will be described in more detail later, the thickness of at least conductor 39 can be selected to assist in dissipating heat from semiconductor device 10 caused by a surge event.

Figure 4:
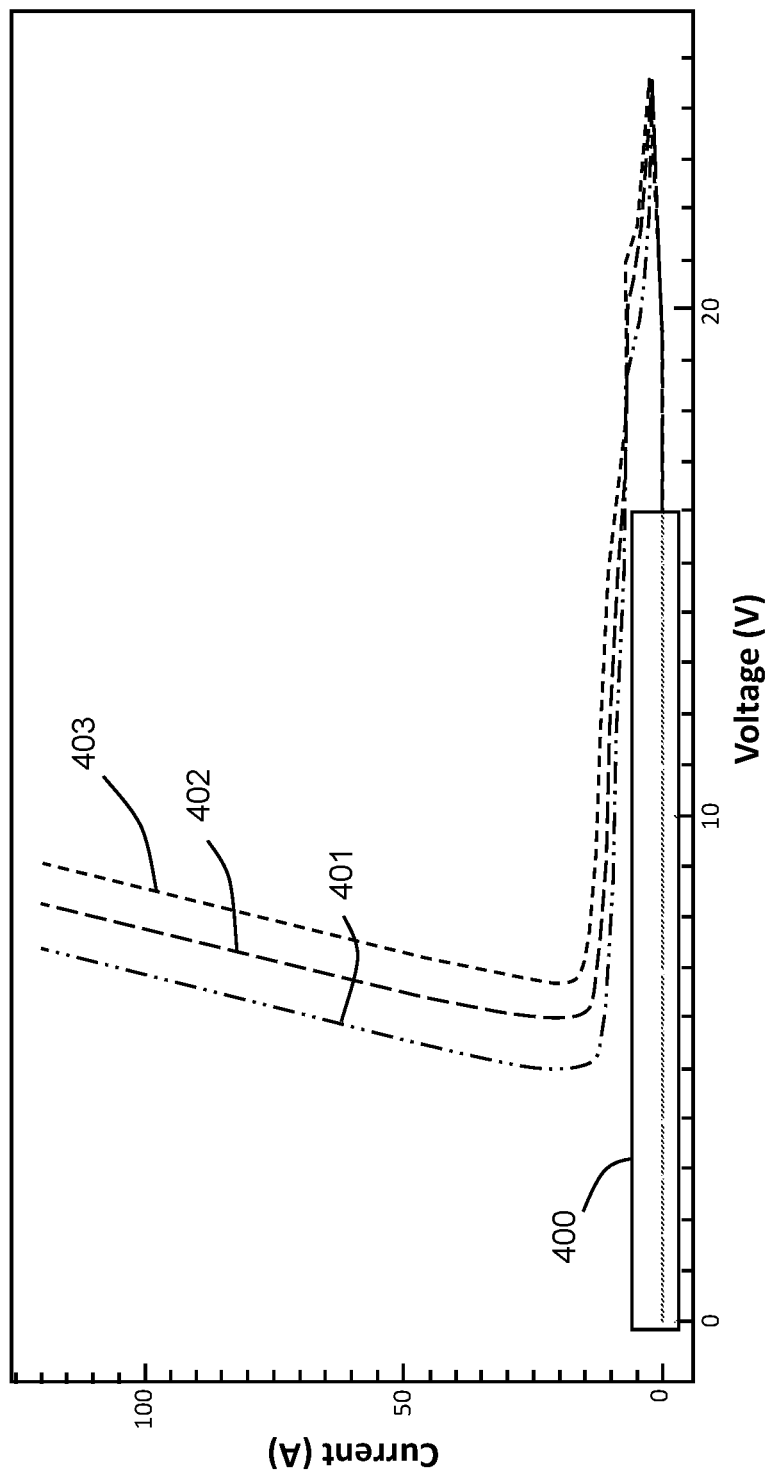
FIG. 4 graphically illustrates current/voltage (IV) characteristics of semiconductor devices in accordance with the present description rated for 16 volt maximum working reverse voltage (Vrwm) with different substrate dopant concentrations in accordance with the present description.
Figure 5:
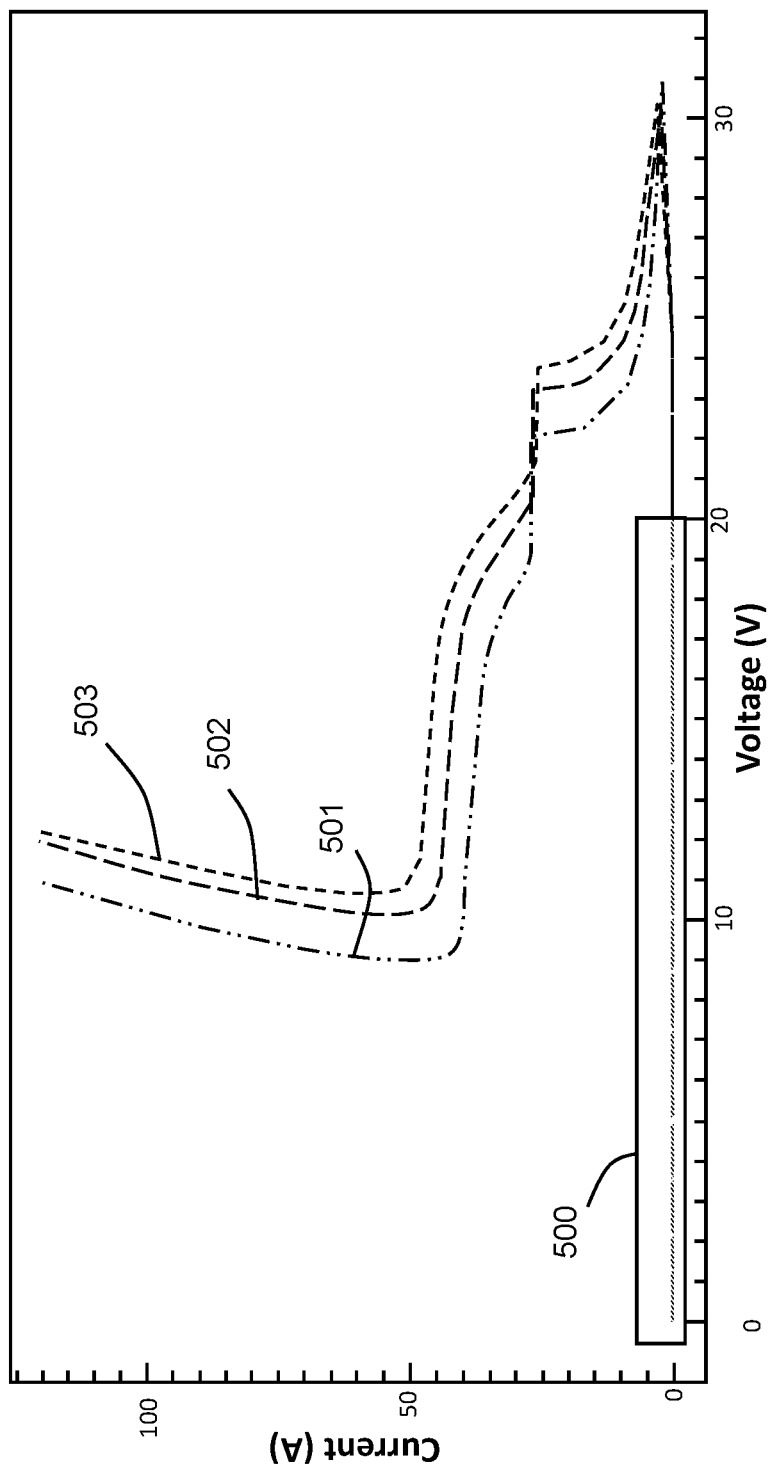
FIG. 5 graphically illustrates current/voltage (IV) characteristics of a semiconductor devices in accordance with the present description rated for 20 volt maximum working reverse voltage (Vrwm) with different substrate dopant concentrations in accordance with the present description.

FIGS. 4 and 5 graphically illustrates current/voltage (IV) characteristics of semiconductor devices, such as semiconductor device 10 in accordance with the present description rated for 16 volt (Vrwm) (FIG. 4) and 20 volt (Vrrm) (FIG. 5) with different dopant concentrations for semiconductor substrate 207. IV characteristics 401 and 501 correspond to substrate dopant concentration of $1.82 \times 10^{16}$ atoms/cm$^3$, IV characteristics 402 and 502 correspond to a substrate dopant concentration of $2.6 \times 10^{16}$ atoms/cm$^3$, and IV characteristics 403 and 503 correspond to a substrate dopant concentration of $3.38 \times 10^{16}$ atoms/cm$^3$. In this example, the substrate dopant concentration for IV characteristics 401 and 501 are about 30% less than the substrate dopant concentration of IV characteristics 402 and 502, and the substrate dopant concentration of IV characteristics 503 and 503 are about 30% greater than the substrate dopant concentration of IV characteristics 402 and 502. Elements 400 and 500 are representative system operating areas for the present examples.

Holding current is related to conductivity modulation in the drift region of semiconductor device 10. Conductivity modulation is a function of diffusion length of minority carriers and if the drift region width is less than the diffusion length of the minority carriers then conductivity enhancement occurs. Minority carrier lifetime is inversely proportional to on-state voltage drop. More particularly, as minority carrier lifetime decreases, minority carriers in the drift region also decrease thereby increasing the on-state voltage.

This is shown in FIGS. 4 and 5 where an increase in substrate dopant concentration increases the on-state voltage characteristics of semiconductor device 10. As described previously, thickness 207A of semiconductor substrate 207 can be used to control the on-state voltage characteristics of semiconductor device 10.

Figures 6, 7:
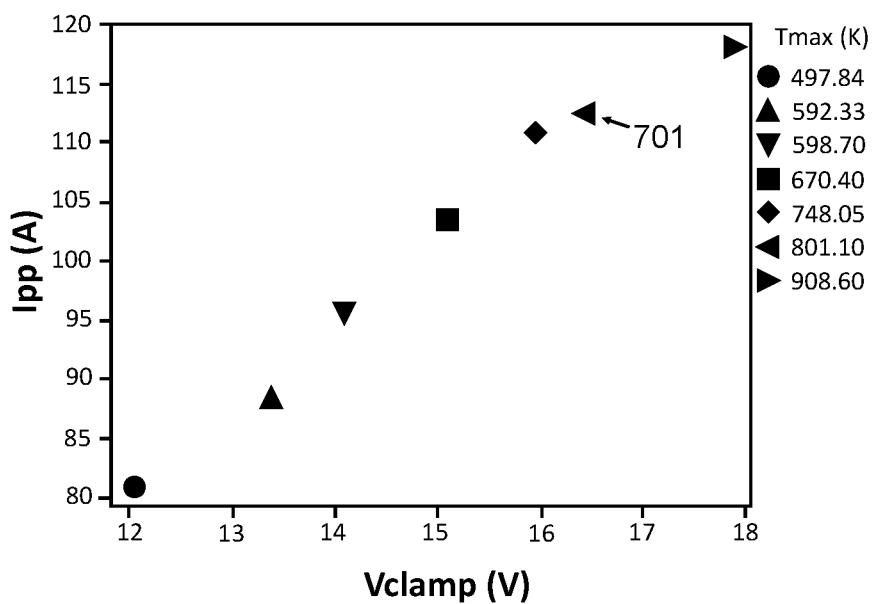
FIG. 6 is a table of electrical characteristics of a semiconductor device in accordance with the present description.
FIG. 7 graphically illustrates thermal data at various surge currents and clamping voltages of a semiconductor device in accordance with the present description.

FIG. 6 is a table 60 of electrical characteristics of semiconductor device 10 configured as a 16 volt (Vrwm) device in accordance with the present description. In the present example, semiconductor substrate 207 has a dopant concentration of $2.6 \times 10^{16}$ atoms/cm$^3$ as noted in the table. The VSurge column corresponds to surge voltages (V) applied to semiconductor device 10 in accordance with International Standard IEC 61000-4-5 including 650 volts, 700 volts, and 760 volts. Table 60 further includes the peak surge current (Peak Ipp (A)) for each of the applied surge voltages, the clamping voltage at the peak surge current (Vclamp@pkIpp (V)), the peak temperature of semiconductor device 10 resulting from the surge event in degrees Kelvin (K), and the turn-on voltage (Vbr@1 mA). It is understood that a peak temperature of about 800 K is the upper limit that a surge protection semiconductor device can withstand before destructive damage can begin to occur. As shown in table 60, a surge voltage of 760 volts applied to semiconductor device 10 resulted in about 112 amps of peak surge current at clamping voltage of 16.43 volts and a maximum temperature of about 800 K. These results were within application defined specifications that required Ippmax to be at least 60 amps and the maximum clamping voltage to be less than 23 volts. Similar results were found in practice for semiconductor device 10 configured as a 20 volt (Vrwm) device where an Ippmax of 83 amps was obtained (specification requires 50 amps minimum) and a clamping voltage of 16.7 volts was obtained (application defined specification required less than 26 volts). These results show that semiconductor device 10 in accordance with the present description provides excellent surge protection.

Figure 8:
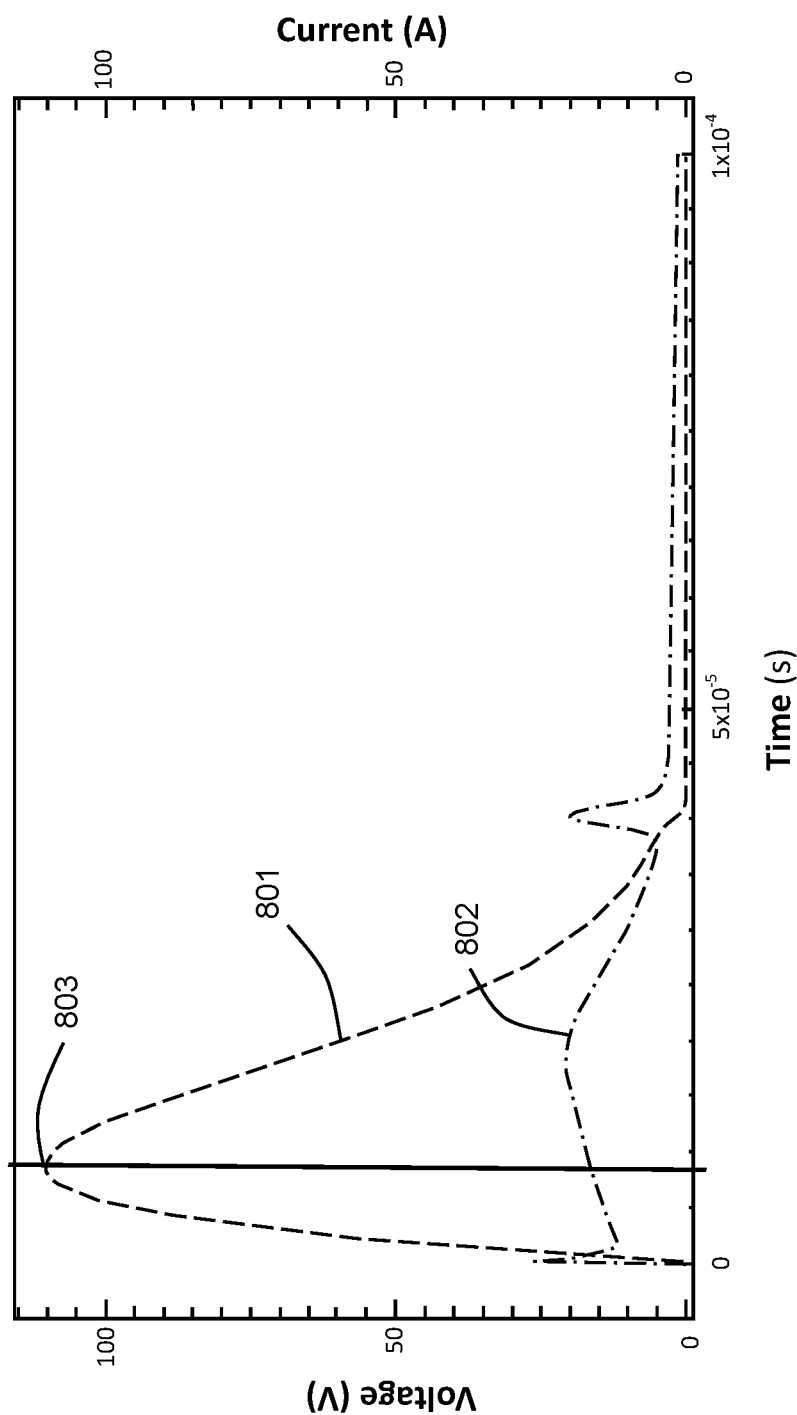
FIG. 8 graphically illustrates example surge characteristics of a semiconductor device in accordance with the present description.
Figure 9:
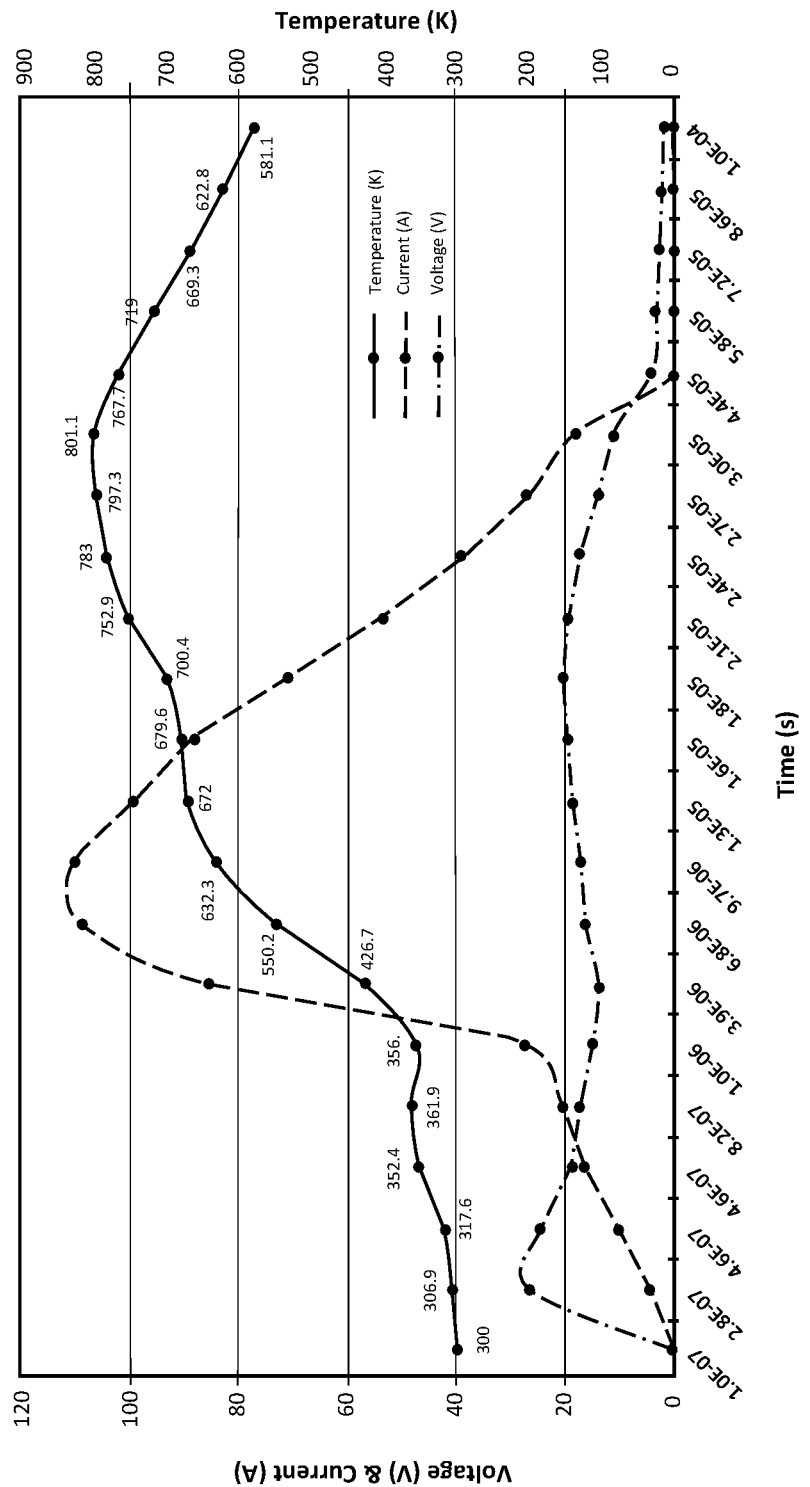
FIG. 9 graphically illustrates an example thermal response for a semiconductor device in accordance with the present description under surge conditions.

FIG. 7 graphically illustrates thermal data (Tmax(K)) at various surge currents (Ipp(A)) and clamping voltages (Vclamp(V)) of semiconductor device 10 configured as a 16 volt (Vrwm) device in accordance with the present description. FIG. 7 includes the data from table 60 and point 701 shows that Ippmax is about 112 amps with a clamping voltage of about 16.4 volts in the present example and a lattice temperature of about 801.1 K FIG. 8 graphically illustrates a current and voltage response of semiconductor device 10 over time (in seconds) with an applied surge voltage of 760 volts. Response 801 corresponds to the current response of semiconductor device 10 versus time, and response 802 corresponds to the voltage response of semiconductor device 10 versus time. Point 803 corresponds to the Ippmax of about 112 amps, which resulted in Tmax of about 801.1 K. FIG. 9 graphically illustrates the current and voltage response of semiconductor device 10 over time (in seconds) of FIG. 8 further with the thermal response in degrees Kelvin, which shows that the peak temperature of semiconductor device 10 lags the peak current Ippmax because of, among other things, the material properties of region of semiconductor material 201. A similar result was found in practice for 20 volt (Vrwm) device.

Figure 10:
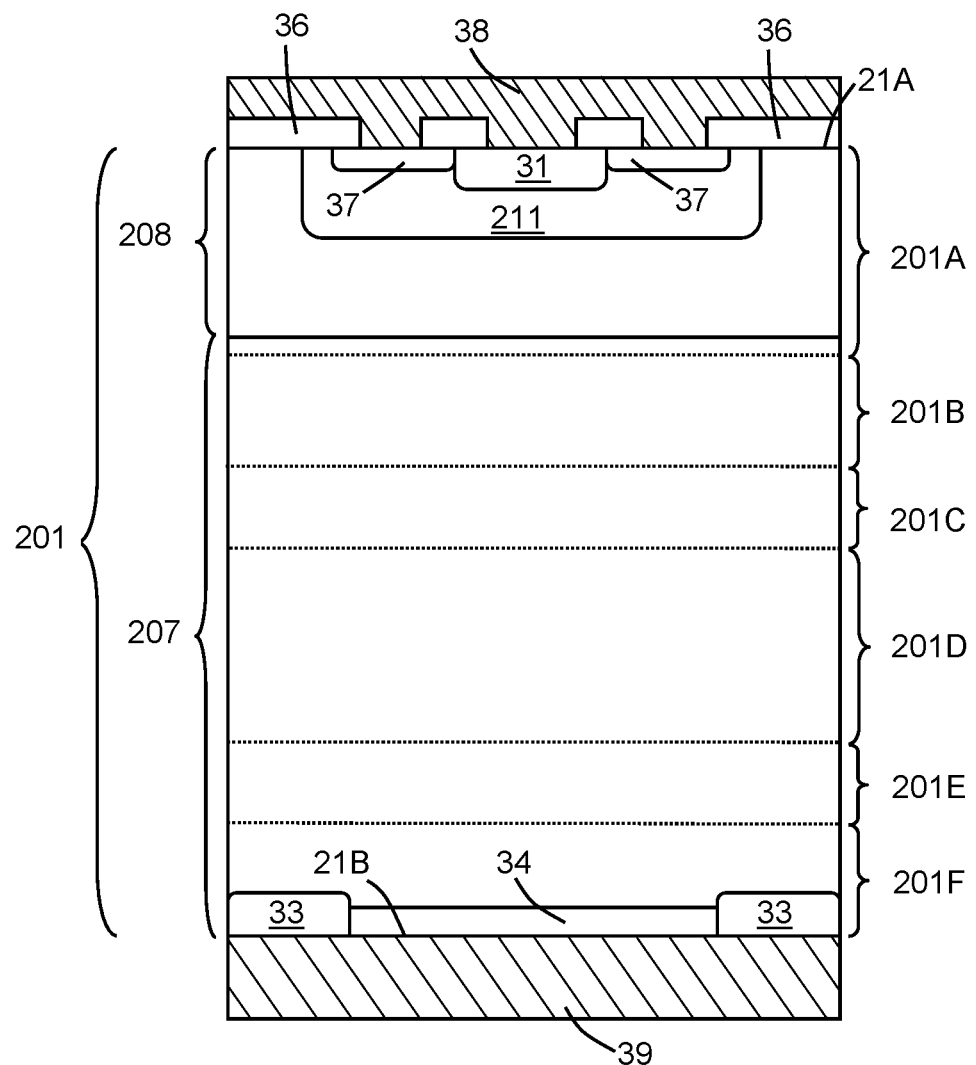
FIG. 10 illustrates a cross-sectional view of an example semiconductor device in accordance with the present description.

FIG. 10 illustrates a cross-sectional view of semiconductor device 10 with denoted regions 201A, 201B, 201C, 201D, 201E, and 201F extending from top side 21A of region of semiconductor material 201 to bottom side 21B. Regions 201A through 201F correspond regions where lattice temperatures were measured to determine hot spots within semiconductor device 10 after the applied surge voltage of 760 volts. It is understood that a hot spot can move with the pulse at different times during the surge event. FIG. 10 corresponds to the measured lattice temperatures at Ippmax in FIGS. 7-9 at a time when the peak temperature was reached. In this example, the peak lattice temperature was measured in region 201D with a peak temperature over 800 K at the center of region 201D, regions 201C and 201E had the second highest peak temperatures of about 750 K at the respective centers of those regions, regions 201B and 201F had the third highest peak temperatures of about 600 K and the respective centers of those regions, and region 201A at the lowest peak lattice temperature of about 500 K at the center of that region. The lowest peak lattice temperature of about 430 K was proximate to top side 21A. As shown in FIG. 10, the highest peak lattice temperature was closer to bottom side 21B than to top side 21A of semiconductor device 10. This shows that using heat dissipation techniques proximate to bottom side 21B of semiconductor device 10 can be beneficial for surge protection in accordance with the present description. Such heat dissipation techniques can include thicker metal for conductor 39, high thermal conductivity die attach materials, and heat sink structures proximate to back side 21B.

Figure 11:
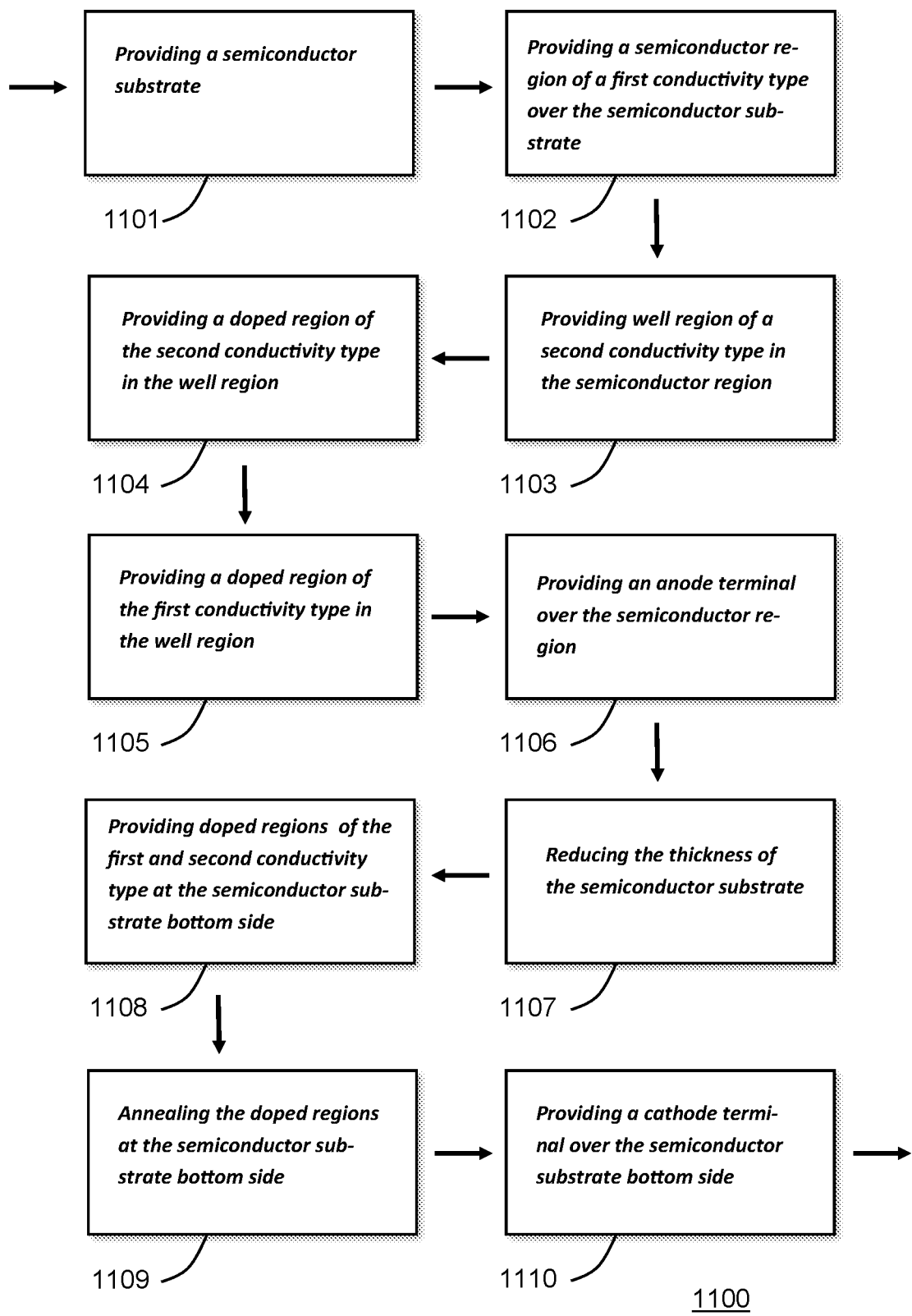
FIG. 11 illustrates a flow diagram of an example method of manufacturing a semiconductor device in accordance with the present description.

FIG. 11 illustrates a flow diagram of an example method of manufacturing a semiconductor device, such as semiconductor device 10, in accordance with the present description. It is understood that common processing steps or sub-steps may be included as part of or in between the blocks described in FIG. 11 and are not described herein.

Block 1101 describes a step of providing a semiconductor substrate. In some examples, the semiconductor substrate can be semiconductor substrate 207 described previously. In some examples, the semiconductor substrate can be a silicon wafer, such as a 200 millimeter (mm) or a 300 mm silicon wafer. The semiconductor substrate can comprise other semiconductor materials as well. In some examples, semiconductor substrate 207 can have a <111> orientation, but this should not be construed as a limitation as other orientations can be used. In some examples, the semiconductor substrate has P-type conductivity and has a boron dopant concentration between $1.0 \times 10^{16}$ atoms/cm$^3$ and $4.0 \times 10^{16}$ atoms/cm$^3$ for some applications, such as semiconductor device 10 configured as a 16 volt (Vrwm) or 20 volt (Vrwm) device. It is understood that other dopant concentrations can be used depending on the required specifications of semiconductor device 10. The semiconductor substrate can be provided as a Czochralski (CZ) substrate, a float zone substrate, or other substrate types as known to one of ordinary skill in the art.

Block 1102 describes a step of providing a semiconductor region of a first conductivity type over the semiconductor substrate. In some examples, the semiconductor region can be semiconductor region 208 described previously. In some examples, epitaxial growth techniques are used to provide the semiconductor region. In some examples, the semiconductor region comprises silicon, has a P-type conductivity, and has a dopant concentration that is greater than the semiconductor substrate. The dopant concentration of semiconductor region 208 can be selected in accordance with the desired electrical characteristics of semiconductor device 10. In some examples where semiconductor device 10 is configured as a 16 volt (Vrwm) device, the semiconductor region can be doped with boron having a dopant concentration between $4.5 \times 10^{17}$ atoms/cm$^3$ and $6.0 \times 10^{17}$ atoms/cm$^3$, and can have a thickness between 7 microns and 15 microns. In some examples where semiconductor device 10 is configured as a 20 volt (Vrwm) device, the semiconductor region can be doped with boron having a dopant concentration between $2.0\times10^{17}$ atoms/cm$^3$ and $4.0\times10^{17}$ atoms/cm$^3$, and can have a thickness between 7 microns and 15 microns. The dopant profile for the semiconductor region can be uniform or non-uniform (e.g., a graded dopant profile). In other examples, the semiconductor region can be formed using doping and diffusion techniques so that the semiconductor region is within the semiconductor substrate. Other formation techniques can be used alone or in combination with those described above. Such techniques include, but are not limited to wafer bonding, liquid phase epitaxy, or atomic layer deposition (ALD). It is understood that Blocks 1101 and 1102 can be combined as a step of providing a region of semiconductor material, such as providing region of semiconductor material 201 described previously.

Block 1103 describes a step of providing a well region of a second conductivity type in the semiconductor region. In some examples, the well region can be well region 211 and can have an N-type conductivity as described previously. In some examples, a mask can be provided over the semiconductor region and provided with an opening(s) corresponding to the predetermined location of well region 211. In some examples, the mask can be a patterned dielectric, such as a patterned oxide having a thickness sufficient to block dopant from reaching areas of the semiconductor region where the dopant is not desired. Photolithographic and etch techniques can be used to form the opening(s). In some examples, ion implantation can be used to provide the dopant source for the well region. In other examples, chemical vapor deposition (CVD), spin-on, solid source, or other doping techniques as known to one of ordinary skill in the art can be used. In some examples when the semiconductor device is configured as a 16 volt (Vrwm) device, the well region can be doped with phosphorous using an ion implantation dose between $1.0\times10^{13}$ atoms/cm$^2$ and $2.0\times10^{13}$ atoms/cm$^2$ at 100 keV and a anneal time of 280 minutes to 320 minutes at 1150 degrees Celsius. For a 20 volt (Vrwm) device, the well region can be doped with phosphorous using an ion implantation dose between $4.0\times10^{13}$ atoms/cm$^2$ and $6.0\times10^{13}$ atoms/cm$^2$ at 100 keV and a anneal time of 140 minutes to 160 minutes at 1150 degrees Celsius. In some examples, the well region extends into semiconductor region 208 to a depth between 2 microns and 5 microns.

Block 1104 describes a step of providing a doped region of the second conductivity type in the well region and Block 1105 describes a step of providing a doped region of the first conductivity type in the well region. In some examples, this includes N-type conductivity doped region 37 and P-type conductivity doped region 31 formed in well region 211. In some examples, a first mask is provided over the semiconductor region with openings for the doped region of the first conductivity type (for example, N-type conductivity doped region 37). In some examples, the first mask can be a patterned photoresist layer having sufficient thickness to block dopant from reaching areas of the well region where the dopant is not desired. In some examples, ion implantation using phosphorous is used to form the doped region of the second conductivity type. In some examples, an ion implantation dose between $6.0\times10^{14}$ atoms/cm$^2$ and $8.0\times10^{14}$ atoms/cm$^2$ at 60 keV can be used. The first mask can then be removed, and a second mask is provided over the semiconductor region with an opening for the doped region of the second conductivity type (for example, P-type doped region 31). In some examples, the second mask can be a patterned photoresist layer having sufficient thickness to block dopant from reaching areas of the well region where the dopant is not desired. In some examples, an ion implantation dose between $8.0\times10^{14}$ atoms/cm$^2$ and $1.0\times10^{15}$ atoms/cm$^2$ at 40-60 keV can be used. The second mask can then be removed, and the semiconductor substrate can be heated to a temperature of 1100 degrees Celsius for 20 minutes to 40 minutes to anneal, activate, and diffuse the implanted dopant to form the doped regions. It is understood that other doping techniques can be used as described herein to form the doped regions of Blocks 1104 and 1105. In some examples, additional dielectric is formed during the anneal process to form, for example, dielectric 36 over semiconductor region 208 as described previously in conjunction with FIG. 3. In some examples, the sequence of doping can be reversed.

Block 1106 describes a step of providing an anode terminal over the semiconductor region. In some examples, this can be conductor 38 over semiconductor region 208, which provides an anode terminal to doped region 37 and doped region 31. In some examples, one or more deposition techniques are used to form the anode terminal. Such techniques can include evaporation, CVD, sputtering, plating, or other deposition techniques as known to one of ordinary skill in the art. In some examples, the anode terminal comprises one or more metals or metal layers. In some examples, the anode terminal can comprise copper (in some examples, with an intervening barrier material) or an aluminum alloy, such as aluminum (Al)-silicon (Si)-copper (Cu) alloy. In some examples, a solderable material or sintering material is provided over the aluminum alloy. In other examples, the anode terminal can comprise titanium (Ti) nickel (Ni) silver (Ag) or chromium (Cr) Ni gold (Au). After the deposition, the material can be patterned using, for example, photolithographic and etch techniques to provide the anode terminal in a desired pattern. In some examples, conductor 38 can be provided with a thickness in range from 2 microns to 20 microns.

Block 1107 describes a step of reducing the thickness of the semiconductor substrate. In some examples, this can include reducing the thickness of semiconductor substrate 207 to provide bottom side 21B as illustrated in FIG. 3. As described previously, the semiconductor substrate provides a drift region for the semiconductor device, so the final thickness of the semiconductor substrate helps determine such electrical parameters as the holding current and the on-state voltage. In some examples, the final thickness of the semiconductor substrate is between 75 microns and 140 microns. In other examples, the final thickness is between 75 microns and 100 microns, which is substantially thinner than conventional power semiconductor device substrates. To obtain these small thicknesses, is some examples a Taiko® type thinning process from Disco Corporation of Tokyo, Japan is used where the front side of the semiconductor wafer is protected during the removal process, and the center portion of the semiconductor wafer is thinned to the desired thickness while an outer ring of material remains at the periphery of the semiconductor wafer to add stability to the semiconductor wafer. It is understood that other thinning processes can be used instead of or in addition to a Taiko type thinning process.

Block 1108 describes a step of providing doped regions of the first and second conductivity type at the semiconductor substrate bottom side. In some examples, this can include forming N-type conductivity doped region 34 and P-type conductivity doped region 33 at bottom side 21B of region of semiconductor material 201 as illustrated in FIG. 3. In some examples, a first mask is provided adjacent to the bottom side of the semiconductor substrate that has an opening(s) for the doped region of the first conductivity type (for example, N-type conductivity doped region 34). It understood that the opening(s) can be provided as an opening structure that is continuous or can be provided as multiple discrete openings. In some examples, the first mask can be a patterned photoresist layer having sufficient thickness to block dopant from reaching areas of the semiconductor substrate where the dopant is not desired.

In some examples, dual or double-sided photolithographic techniques are used to provide the first mask so that it is in predetermined alignment with the well region and the doped regions at the top side of the semiconductor region. More particularly, the doped region of the first conductivity type is a patterned doped region as opposed to a blanket doped region that extends entirely across the bottom side of the semiconductor substrate. Using the first mask is an example of selectively forming doped region 37. In some examples, ion implantation using phosphorous is used to form the doped region of the second conductivity type. In some examples, an ion implantation dose between $6.0 \times 10^{14}$ atoms/cm$^2$ and $8.0 \times 10^{14}$ atoms/cm$^2$ at 60 keV can be used.

The first mask can then be removed, and a second mask is provided adjacent to the bottom side of the semiconductor substrate with an opening(s) for the doped region of the second conductivity type (for example, P-type doped region 33). It understood that the opening(s) can be provided as an opening structure that is continuous or can be provided as multiple discrete openings. In some examples, the second mask can be a patterned photoresist layer having sufficient thickness to block dopant from reaching areas of the semiconductor where the dopant is not desired. In accordance with the present description, dual or double-sided photolithographic techniques are used to provide the second mask so that it is in predetermined alignment with the well region and the doped regions at the top side of the semiconductor region and the bottom side of the semiconductor substrate. More particularly, the doped region of the second conductivity type is a patterned doped region as opposed to a blanket doped region that extends entirely across the bottom side of the semiconductor substrate. Using the second mask is an example of selectively forming doped region 33. In some examples, a boron ion implantation dose between $8.0 \times 10^{14}$ atoms/cm$^2$ and $1.0 \times 10^{15}$ atoms/cm$^2$ at 40-60 keV can be used. The second mask can then be removed. In other examples, one of the doped regions can be an unmasked or blanket doped region (for example, doped region 34) and the other doped region (for example, doped region 33) is a patterned doped region. That is, at least one of the doped regions is a patterned doped region. In some examples, the patterned doped can be doped region 33. In some examples, the patterned doped region can be doped region 34.

Block 1109 describes a step of annealing the doped regions of the first conductivity type and the second conductivity type at the semiconductor substrate bottom side. In accordance with the present description, since the semiconductor substrate has the anode terminal in place, localized annealing is uses to activate the dopant used to form the first and second conductivity type doped regions on the semiconductor substrate bottom side. In some examples, a localized laser annealing process is used that locally heats the lattice of the semiconductor substrate proximate to the semiconductor substrate bottom side while the opposite side of the semiconductor substrate including the anode terminal remains at a cooler temperature. This protects the anode terminal from damage.

Block 1110 describes a step of providing a cathode terminal over the semiconductor substrate bottom side. In some examples, this includes conductor 39 provided over bottom side 21B of region of semiconductor material 201 as illustrated in FIG. 3, which connects to or contacts doped regions 33 and 34. In some examples, the cathode terminal comprises one or more metals or metal layers. In some examples, the cathode terminal can comprise titanium (Ti) nickel (Ni) silver (Ag) or chromium (Cr) Ni gold (Au). In other examples, the cathode terminal comprises copper (in some examples with an intervening barrier material). In accordance with the present description, the cathode terminal is provided with a thickness that assists in heat dissipation caused by surge events that semiconductor device 10 is configured to protect. In some examples, the cathode terminal has a thickness between 2 microns and 20 microns or more. After the cathode terminal is provided, the semiconductor wafer can be tested and separated into individual semiconductor devices, such as semiconductor devices 10.

Figure 12:
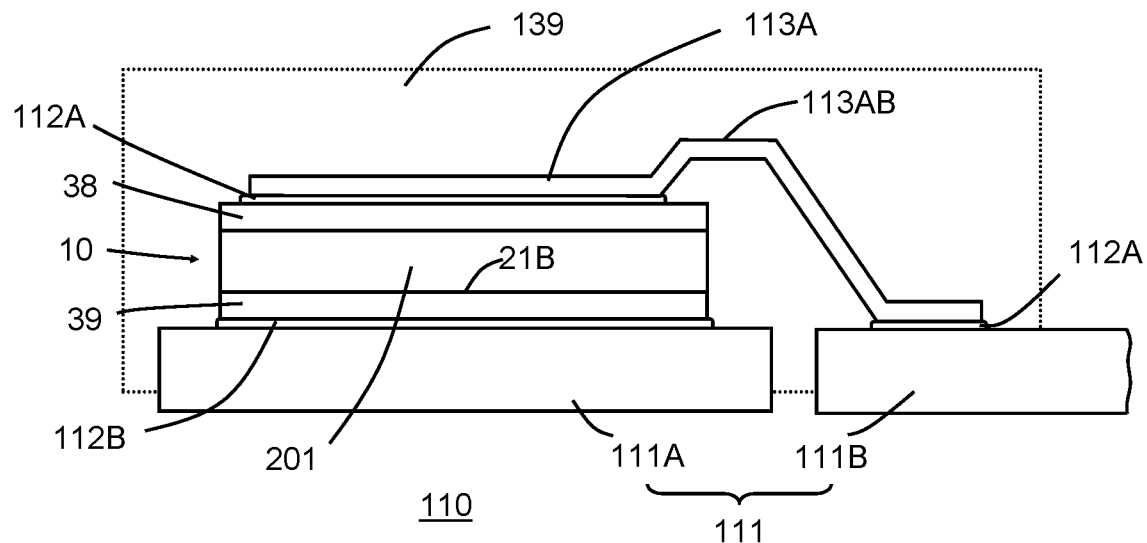
FIG. 12 illustrates a side view of an example packaged semiconductor device in accordance with the present description.
Figure 13:
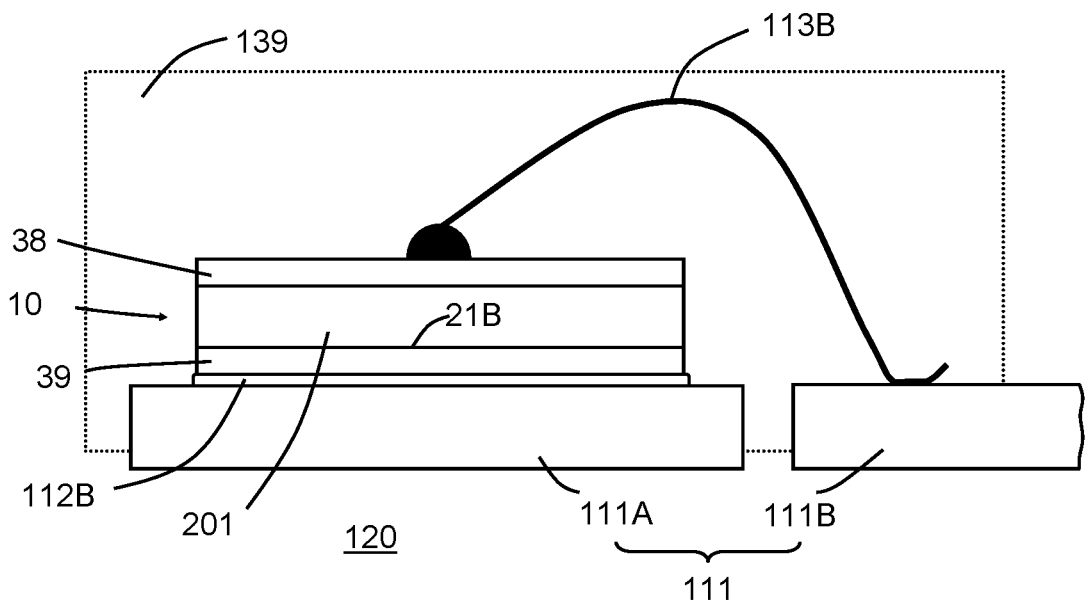
FIG. 13 illustrates a side view of an example packaged semiconductor device in accordance with the present description.

FIGS. 12 and 13 illustrate side views of packaged semiconductor devices 120 and 130 respectively that include semiconductor devices 10 as described herein. In some examples, packaged semiconductor devices 120 and 130 include a substrate 111, which can include a die pad or die paddle 111A and leads 111B, semiconductor device 10, interconnects 113A (FIG. 12) and 113B (FIG. 13), and a package body 139 that encapsulates semiconductor device 10, interconnects 113A and 113B, and portions of die pad 11A and leads 111B. In some examples, substrate 11 can be a lead frame type substrate, but it is understood that other types of package substrates can be used. In FIGS. 12 and 13, package body 139 is shown as transparent to illustrate the internal components of the packaged semiconductor devices.

In packaged semiconductor device 120, interconnect 113A comprises a conductive clip, which can be a metal clip, such as a copper or a copper alloy clip. The metal clip can also include a plated region on external surfaces of a clip core. Interconnect 113A is attached to conductor 38 of semiconductor device 10 and to lead(s) 111B with an attachment material 112A. Attachment material 112A can be an electrically and thermally conductive material, such as a solder paste material. As described previously in conjunction with FIG. 10, it is desirable to promote heat dissipation at least at the bottom side 21B of semiconductor device 10. In some examples, this can be achieved by using a thick conductor 39, an attachment material 112B with a high thermal conductivity, such as a metal alloy or an epoxy (e.g., Loctite® Ablestik 8008HT available from Caplinq of Assendelft, The Netherlands), and die pad 111A comprising a high thermal conductivity material, such as copper or a copper alloy. It is understood that an additional heat sink structure can be attached to die pad 111A at a next level of assembly. In addition, the thickness of both conductor 38 and interconnect 113A can be increased to further provide enhanced heat dissipation from semiconductor device 10 at top side 21A. In some examples, a portion (for example, portion 113AB) of interconnect 113A can be exposed at a top side of package body 139.

In packaged semiconductor device 130, interconnect 113B comprises one or more wire bonds that are connected to conductor 38 and lead(s) 111B using wire bonding techniques. The wire bonds can include thicker wire to promote heat dissipation and that can handle surge currents. It is understood that in addition to clips and wire bonds, semiconductor device 10 of the present description supports other types of interconnects, such as ribbon bonds.

In summary, a semiconductor device configured as a dual-sided SCR device with improved surge capability and methods of manufacture the semiconductor device have been described. In some examples, the voltage characteristics of the SCR device can be adjusted or tuned using the dopant concentration of a P-type conductivity semiconductor region and the dopant concentration/dopant profile of an N-type conductivity well region. The SCR device is configured to snapback at a higher holding current than the maximum operating current of the application the SCR device is protecting. Also, by its configuration the SCR device avoids the latch-up issues associated with prior devices. In addition, the deep voltage snapback characteristic (Vclamp) of the SCR device at high current (Ipp) materially increases its surge current handling capabilities. In addition, the surge characteristics of the SCR device (for example, Vclamp and IPP) can be optimized using mask layout dimensions at both the anode side and the cathode side of the device. The SCR device supports a variety of semiconductor package interconnect schemes.

It is understood that the different examples described herein can be combined with any of the other examples described herein to obtain different embodiments.

In addition, it is understood that different semiconductor materials can be selected for semiconductor substrate 207 or semiconductor region 208. In some examples, semiconductor substrate 207 and semiconductor region 208 can be silicon. However, the present description is relevant to other materials including other heterojunction semiconductor materials, such as SiGe, SiGeC, GaAs, InGaP, GaN, and AN. Further, semiconductor substrate 207 and semiconductor region 208 can be the same or different materials.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed. In addition, other isolation techniques can be used to isolate the active device regions. It is understood that the term semiconductor substrate can refer to an individual semiconductor die, a plurality of semiconductor die, or a semiconductor wafer.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor device, comprising:
a region of semiconductor material comprising:
a top side;
a bottom side opposite to the top side;
a semiconductor substrate of a first conductivity type; and
a semiconductor region of the first conductivity type over the semiconductor substrate;
a well region of a second conductivity type opposite to the first conductivity type in the semiconductor region;
a first doped region of the first conductivity type in the well region;
a second doped region of the second conductivity type in the well region;
a third doped region of the second conductivity type in the semiconductor substrate at the bottom side;
a fourth doped region of the first conductivity type in the semiconductor substrate at the bottom side;
a first conductor coupled to the first doped region and the second doped region at the top side; and
a second conductor coupled to the third doped region and the fourth doped region at the bottom side;
wherein:
one or more of the third doped region or the fourth doped region is a patterned doped region; and
the semiconductor device is configured as a dual-sided semiconductor-controlled rectifier (SCR) device.

2. The semiconductor device of claim 1, wherein:
both the third doped region and the fourth doped region are patterned doped regions;
the third doped region has a first width in a cross-sectional view;
the fourth doped region comprises two portions each on opposing sides of the third doped region in the cross-sectional view;
the two portions of the fourth doped region sum to a second width in the cross-sectional view; and
the first width is different than the second width.

3. The semiconductor device of claim 2, wherein:
the first width is less than the second width.

4. The semiconductor device of claim 2, wherein:
the first width is greater than the second width.

5. The semiconductor device of claim 1, wherein:
the semiconductor substrate has a thickness between 75 microns and 140 microns.

6. The semiconductor device of claim 1, wherein:
the semiconductor substrate has a dopant concentration between $1.0 \times 10^{16}$ atoms/cm$^3$ and $4.0 \times 10^{16}$ atoms/cm$^3$.

7. The semiconductor device of claim 1, wherein:
the second doped region comprises two portions on opposing sides of the first doped region in a cross-sectional view.

8. The semiconductor device of claim 1, further comprising:
a substrate having a die pad and leads, wherein the second conductor of the semiconductor device is attached to the die pad with a first attachment material, and the first conductor is coupled to the leads with an interconnect; and
a package body encapsulating the semiconductor device and at least portions of the interconnect.

9. The semiconductor device of claim 8, wherein:
the die pad is a metal;
the first attachment material comprises a high thermal conductivity material; and
the second conductor has a thickness between 2 microns and 9 microns.

10. The semiconductor device of claim 1, wherein:
the third doped region and the fourth doped region are ion implanted regions.

11. A semiconductor device, comprising:
a region of semiconductor material comprising:
a top side;
a bottom side opposite to the top side;
a semiconductor substrate of a first conductivity type and a semiconductor substrate thickness; and
a semiconductor region of the first conductivity type over the semiconductor substrate, wherein the semiconductor region has a higher peak dopant concentration than the semiconductor substrate;

a well region of a second conductivity type opposite to the first conductivity type in the semiconductor region;
a first doped region of the first conductivity type in the well region;
a second doped region of the second conductivity type in the well region laterally adjacent to the first doped region;
a third doped region of the second conductivity type in the semiconductor substrate at the bottom side;
a fourth doped region of the first conductivity type in the semiconductor substrate at the bottom side laterally adjacent to the third doped region;
an anode terminal coupled to the first doped region and the second doped region at the top side; and
a cathode terminal coupled to the third doped region and the fourth doped region at the bottom side;
wherein:
the fourth doped region is a patterned doped region; and
the fourth doped region comprises two portions that are on opposing sides of the third doped region in a cross-sectional view.

12. The semiconductor device of claim 11, wherein:
the third doped region is a patterned doped region;
the semiconductor substrate thickness is between 70 microns and 100 microns; and
the semiconductor device is configured as a two-terminal dual-sided vertical semiconductor-controlled rectifier (SCR) device.

13. The semiconductor device of claim 11, wherein:
the cathode terminal is thicker than the anode terminal.

14. The semiconductor device of claim 12, wherein:
the semiconductor device has a device width in the cross-sectional view;
the third doped region has a first width in the cross-sectional view;
the two portions of the fourth doped region sum to a second width in the cross-sectional view; and
the first width is between 40% and 60% of the device width.

15. The semiconductor device of claim 14, wherein:
the semiconductor device is configured as a two-terminal dual-sided vertical semiconductor-controlled rectifier (SCR) device;
the second width is different that the first width; and
the second width is pre-selected to adjust holding current of the SCR device to a predetermined level.

16. A method of manufacturing a semiconductor device, comprising:
providing a region of semiconductor material comprising:
a top side;
a semiconductor substrate of a first conductivity type; and
a semiconductor region of the first conductivity type over the semiconductor substrate;
providing a well region of a second conductivity type opposite to the first conductivity type in the semiconductor region;
providing a first doped region of the first conductivity type in the well region;
providing a second doped region of the second conductivity type in the well region;
providing a first conductor coupled to the first doped region and the second doped region at the top side;
reducing thickness of the semiconductor substrate to provide the semiconductor substrate with a substrate thickness and to define a bottom side of the region of semiconductor material opposite to the top side;
forming a third doped region of the second conductivity type in the semiconductor substrate at the bottom side;
selectively forming a fourth doped region of the first conductivity type in the semiconductor substrate at the bottom side; and
providing a second conductor coupled to the third doped region and the fourth doped region at the bottom side;
wherein:
the semiconductor device is configured as a two-terminal dual-sided semiconductor-controlled rectifier (SCR) device.

17. The method of claim 16, wherein:
reducing the thickness of the semiconductor substrate comprises providing the substrate thickness between 75 microns and 140 microns.

18. The method of claim 16, wherein:
providing the region of semiconductor material includes providing the region of semiconductor material as part of a semiconductor wafer; and
reducing the thickness comprises reducing the thickness of the semiconductor wafer at a center portion of the semiconductor wafer while leaving an outer ring of material at a periphery of the semiconductor wafer.

19. The method of claim 16, wherein:
forming the third doped region comprises selectively forming the third doped region;
selectively forming the third doped region comprises:
providing a first mask over the bottom side with a first mask opening; and
ion implanting the third doped region in the semiconductor substrate at the bottom side through the first mask opening;
selectively forming the fourth doped region comprises:
providing a second mask over the bottom side with a second mask opening; and
ion implanting the fourth doped region in the semiconductor substrate at the bottom side through the second mask opening; and
the method further comprises laser annealing the bottom side to activate dopants in the third doped region and the fourth doped region.

20. The method of claim 19, wherein:
providing the second mask comprises providing the second mask with the second mask opening to provide the fourth doped region with a width pre-selected to adjust holding current of the SCR device to a predetermined level.

* * * * *